United States Patent
Kim

(10) Patent No.: US 11,557,607 B2
(45) Date of Patent: Jan. 17, 2023

(54) SEMICONDUCTOR DEVICE AND MANUFACTURING METHOD OF THE SEMICONDUCTOR DEVICE

(71) Applicant: SK hynix Inc., Icheon-si (KR)

(72) Inventor: Jin Ha Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 31 days.

(21) Appl. No.: 17/390,281

(22) Filed: Jul. 30, 2021

(65) Prior Publication Data

US 2021/0358949 A1 Nov. 18, 2021

Related U.S. Application Data

(63) Continuation of application No. 16/659,889, filed on Oct. 22, 2019, now Pat. No. 11,114,457.

(30) Foreign Application Priority Data

May 13, 2019 (KR) .......................... 10-2019-0055771

(51) Int. Cl.
*H01L 27/11582* (2017.01)
*H01L 27/11556* (2017.01)
*H01L 27/24* (2006.01)

(52) U.S. Cl.
CPC .. *H01L 27/11582* (2013.01); *H01L 27/11556* (2013.01); *H01L 27/249* (2013.01)

(58) Field of Classification Search
CPC ......... H01L 27/11582; H01L 27/11556; H01L 27/249
See application file for complete search history.

(56) References Cited

U.S. PATENT DOCUMENTS

| | | | |
|---|---|---|---|
| 9,536,894 B2 | 1/2017 | Tajima et al. | |
| 2020/0105782 A1* | 4/2020 | Guo | H01L 27/11582 |
| 2020/0135753 A1* | 4/2020 | Zhang | H01L 27/11519 |
| 2020/0143888 A1 | 5/2020 | Rabkin et al. | |
| 2020/0286902 A1* | 9/2020 | Fukuda | H01L 27/11582 |
| 2020/0328227 A1 | 10/2020 | Kang et al. | |
| 2020/0335593 A1* | 10/2020 | Lu | H01L 29/6653 |

FOREIGN PATENT DOCUMENTS

KR   1020190019672 A   2/2019

* cited by examiner

*Primary Examiner* — Christine A Enad
(74) *Attorney, Agent, or Firm* — William Park & Associates Ltd.

(57) ABSTRACT

A semiconductor device includes a stacked structure including conductive layers and insulating layers alternately stacked with each other, and a channel layer passing through the stacked structure, wherein the channel layer is a single layer, the single layer including a first GIDL region, a cell region, and a second GIDL region, and the first GIDL region has a greater thickness than each of the cell region and the second GIDL region.

20 Claims, 16 Drawing Sheets

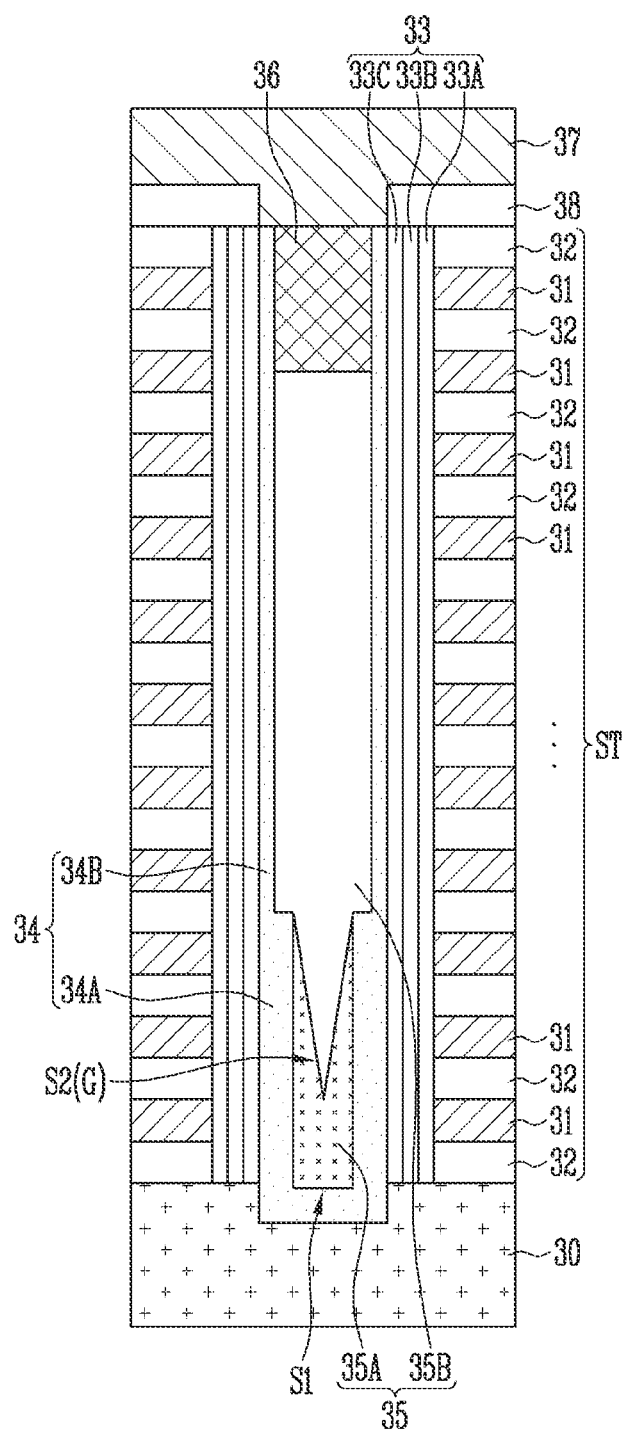

FIG. 5A
FIG. 5B
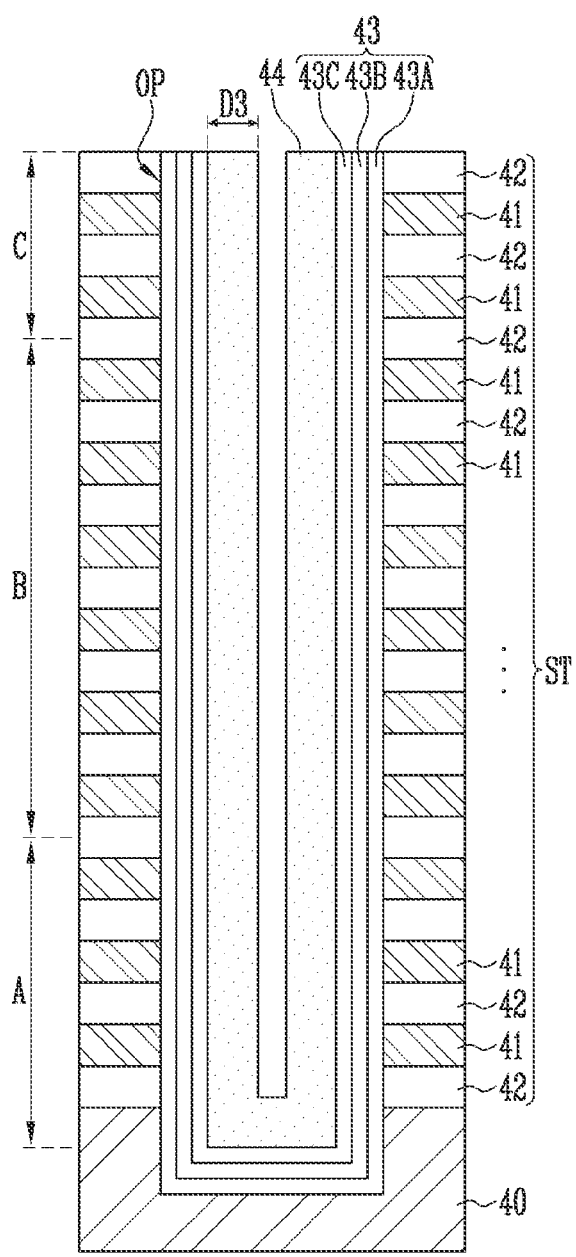
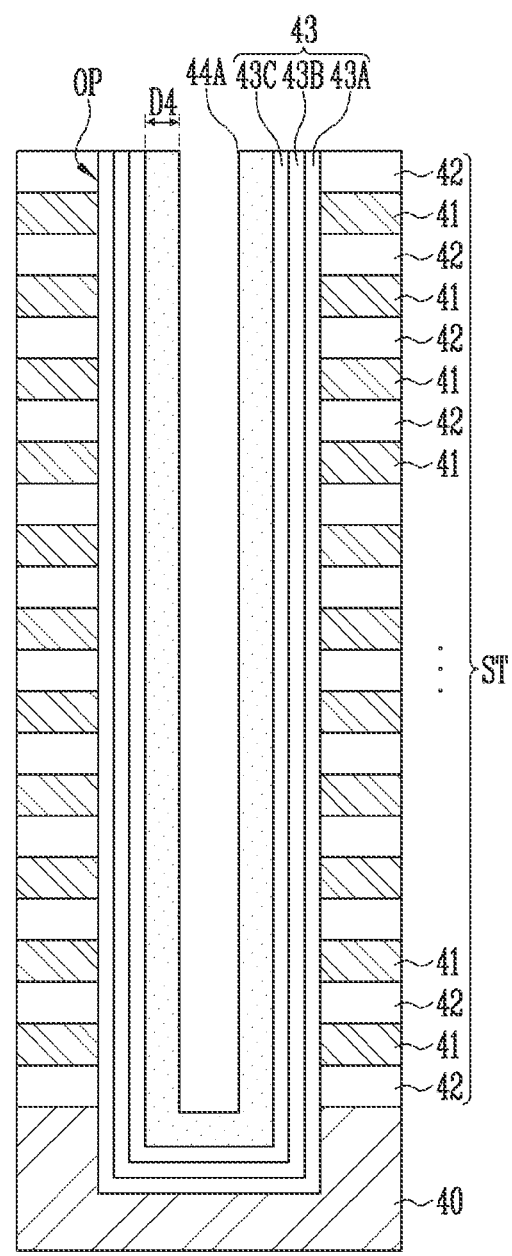

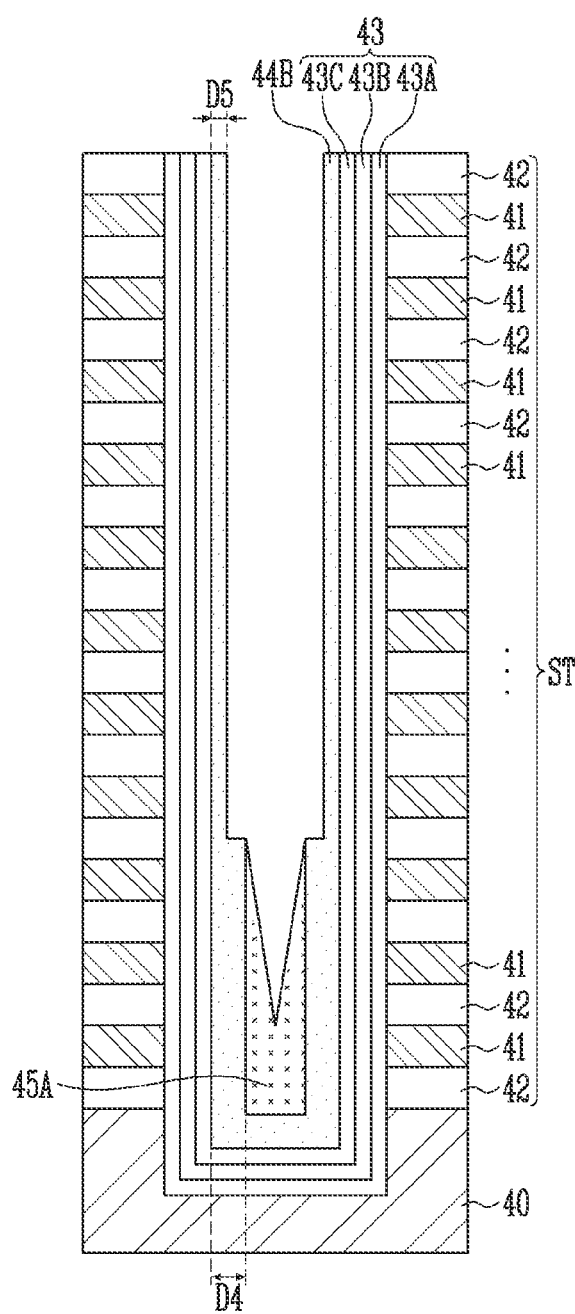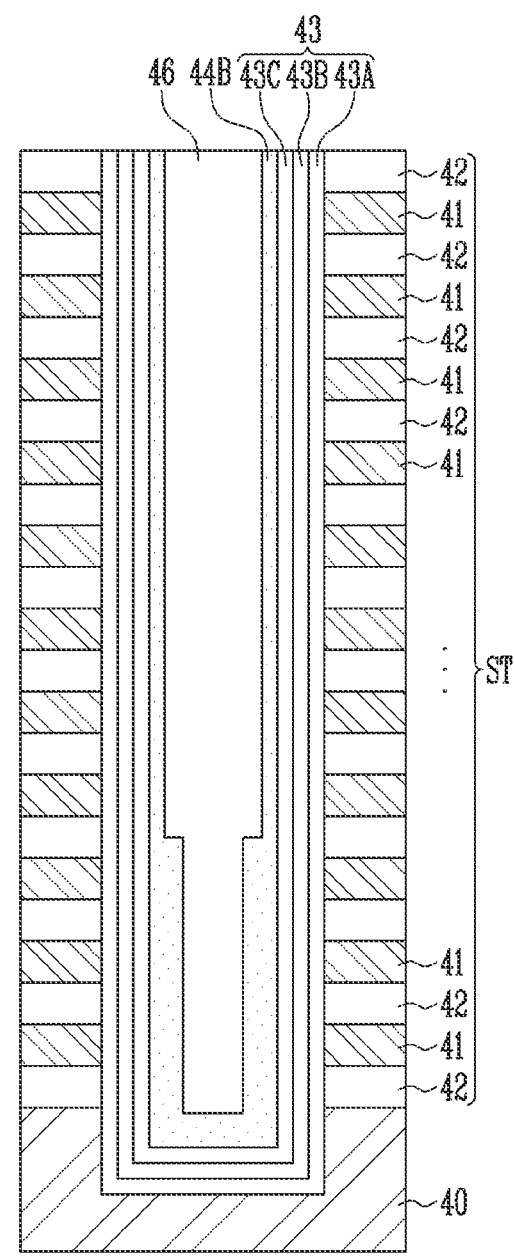

SEMICONDUCTOR DEVICE AND MANUFACTURING METHOD OF THE SEMICONDUCTOR DEVICE

CROSS-REFERENCE TO RELATED APPLICATION

The present application is a continuation application of U.S. patent application Ser. No. 16/659,889, filed on Oct. 22, 2019, and claims priority under 35 U.S.C. § 119(a) to Korean patent application number 10-2019-0055771, filed on May 13, 2019, in the Korean Intellectual Property Office, the entire disclosure of which is incorporated herein by reference.

BACKGROUND

1. Technical Field

Various embodiments generally relate to an electronic device, and more particularly, to a semiconductor device and a manufacturing method of the semiconductor device.

2. Related Art

Non-volatile memory devices retain stored data even in the absence of a power supply. The increase in integration density of two-dimensional non-volatile memory devices in which memory cells are formed in a single layer over a substrate has recently been limited. Thus, three-dimensional non-volatile memory devices have been proposed in which memory cells are stacked in a vertical direction over a substrate.

A three-dimensional non-volatile memory device may include interlayer insulating layers and gate electrodes alternately stacked with each other and channel layers passing through the stacked structure, and memory cells may be stacked along the channel layers. Various structures and manufacturing methods have been developed to improve the operational reliability of three-dimensional non-volatile memory devices.

SUMMARY

According to an embodiment, a semiconductor device may include a stacked structure including conductive layers and insulating layers alternately stacked with each other, and a channel layer passing through the stacked structure, wherein the channel layer is a single layer, the single layer including a first GIDL region, a cell region, and a second GIDL region, and the first GIDL region has a greater thickness than each of the cell region and the second GIDL region.

According to an embodiment, a semiconductor device may include a source layer, a bit line, and a channel layer coupled between the source layer and the bit line, wherein the channel layer is a single layer, the single layer including a first region and a second region, the first region is adjacent to the source layer, the second region is adjacent to the bit line, and the first region has a greater thickness than the second region.

According to an embodiment, a method of manufacturing a semiconductor device may include forming a stacked structure, forming an opening, passing through the stacked structure, forming a channel layer in the opening, the channel layer including a first GIDL region, a cell region and a second GIDL region, forming a sacrificial layer in the channel layer, and etching the cell region and the second GIDL region of the channel layer by using the sacrificial layer as an etching barrier.

According to an embodiment, a method of manufacturing a semiconductor device may include forming a stacked structure, forming an opening passing through the stacked structure, forming a single layer of polysilicon in the opening, the single layer of polysilicon including a first region and a second region, forming a sacrificial layer in the single layer of polysilicon, etching the second region of the single layer of polysilicon by using the sacrificial layer as an etching barrier, and forming a gap-fill insulating layer in the single layer of polysilicon after the second region is etched.

BRIEF DESCRIPTION OF THE DRAWINGS

FIGS. 3A to 3C are cross-sectional diagrams, illustrating the structure of a semiconductor device, according to an embodiment;

FIGS. 5A to 5G are cross-sectional diagrams, illustrating a method of manufacturing a semiconductor device, according to an embodiment;

DETAILED DESCRIPTION

Figure 1A:
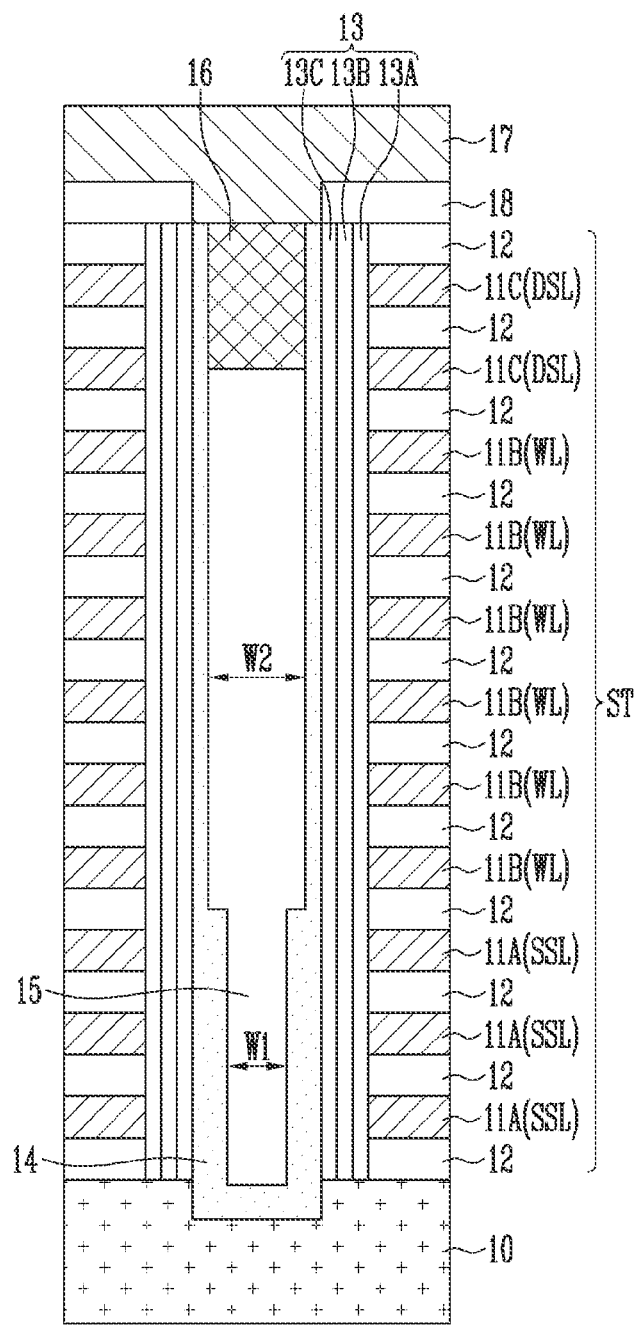
FIGS. 1A and 1B are cross-sectional diagrams, illustrating the structure of a semiconductor device, according to an embodiment.

Hereinafter, various examples of embodiments will be described with reference to the accompanying drawings. In the drawings, thicknesses and distances of components may be exaggerated compared to the actual physical thicknesses and distances for convenience of illustration. In the following description, a description of known related functions and constitutions may be omitted for simplicity and conciseness. Like reference numerals refer to like elements throughout the specification and drawings.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

It is also noted that in this specification, "connected/coupled" refers to one component not only directly connected/coupled to another component but also indirectly connected/coupled to another component through an intervening component. In the specification, when an element is referred to as "comprising" or "including" a component, it does not exclude other components but may further include other components unless a description to the contrary is specifically pointed out in context.

Various embodiments are directed to a semiconductor device with easy manufacturing processes, a stabilized structure and improved characteristics, and a manufacturing method of the semiconductor device.

Figure 1B:
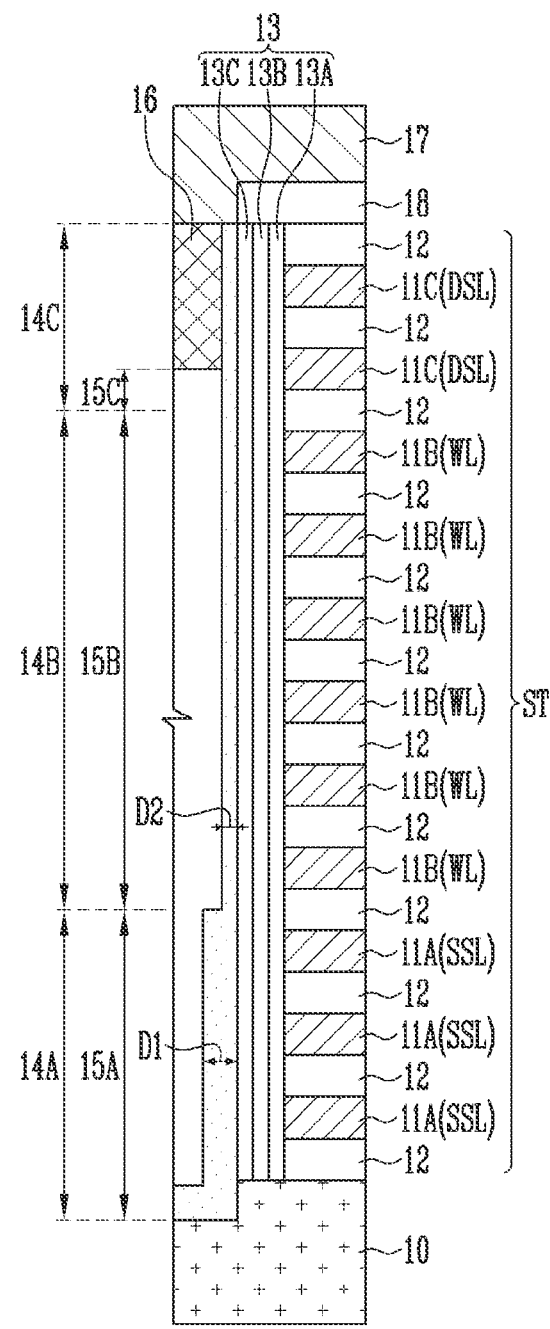

FIGS. 1A and 1B are cross-sectional diagrams, illustrating the structure of a semiconductor device, according to an embodiment.

Referring to FIG. 1A, the semiconductor device, according to an embodiment, may include a stacked structure ST, a channel structure 13, 14, 15, and 16, and a gap-fill insulating layer 15. The semiconductor device may further include at least one of a source layer 10, an interconnection structure 17, and an insulating layer 18.

The stacked structure ST may include conductive layers 11A, 11B, and 11C and insulating layers 12 alternately stacked with each other. The first and third conductive layers 11A and 11C may be select lines. The first conductive layers 11A may be source select lines SSL, and the third conductive layers 11C may be drain select lines DSL. The second conductive layers 11B may be word lines WL. The insulating layers 12 may be provided to insulate the stacked conductive layers 11A, 11B, and 11C from each other and may include an insulating material such as an oxide or a nitride.

The number of first conductive layers 11A, the number of second conductive layers 11B, and the number of third conductive layers 11C included in the stacked structure ST may vary depending on the embodiment. The number of first conductive layers 11A and the number of third conductive layers 11C may be the same or may be different. For example, the number of first conductive layers 11A may be greater than the number of third conductive layers 11C.

The channel structure 13, 14, 15, and 16 may pass through the stacked structure ST. The channel structure 13, 14, 15, and 16 may be a vertical structure and the single channel structure 13, 14, 15, and 16 may correspond to a single memory string. The channel structure 13, 14, 15, and 16 may include the channel layer 14, the memory layer 13, the gap-fill insulating layer 15 and the conductive pad 16.

The channel layer 14 may pass through the stacked structure ST in the direction in which the conductive layers 11A, 11B, and 11C and the insulating layers 12 are stacked. The channel layer 14 may be a vertical structure. The channel layer 14 may be formed in a region where a channel of a select transistor or a memory cell is formed. The channel layer 14 may include a semiconductor material such as silicon (Si) or germanium (Ge).

Select transistors may be located at intersections of the channel layer 14 and the first and third conductive layers 11A and 11C. Source select transistors may be located at intersections of the channel layer 14 and the first conductive layers 11A. Drain select transistors may be located at intersections of the channel layer 14 and the third conductive layers 11C. Memory cells may be located at intersections of the channel layer 14 and the second conductive layers 11B.

In an embodiment, the channel layer 14 may be coupled to the source layer 10. Depending on the embodiment, the bottom surface of the channel layer 14 may contact the source layer 10, the sidewall of the channel layer 14 may contact the source layer 10, or both the bottom surface and the sidewall of the channel layer 14 may contact the source layer 10. In addition, an epitaxial semiconductor layer (not shown) may be located between the channel layer 14 and the source layer 10, coupling the channel layer 14 to the source layer 10.

The gap-fill insulating layer 15 may be formed in the channel layer 14. The gap-fill insulating layer 15 may completely or partially fill the channel layer 14. When partially filled, the gap-fill insulating layer 15 may include a void. A width of the gap-fill insulating layer 15 may vary depending on the region. In addition, the gap-fill insulating layer 15 may be a single layer or a multilayer.

The memory layer 13 may be formed on the sidewall of the channel layer 14. The memory layer 13 may completely or partially surround the sidewall of the channel layer 14. The memory layer 13 may include at least one of a charge blocking layer 13A, a data storage layer 13B, and a tunnel insulating layer 13C. The data storage layer 13B may include a floating gate, a charge trapping material, polysilicon, a nitride, a variable resistance material, a phase-change material, nanodots, or the like.

The conductive pad 16 may be in contact with the channel layer 14 and may couple the channel layer 14 to the interconnection structure 17. The conductive pad 16 may also be in contact with the gap-fill insulating layer 15. The conductive pad 16 may include a conductive material such as polysilicon or tungsten.

The stacked structure ST may be located between the source layer 10 and the interconnection structure 17. The source layer 10 may include a conductive material such as polysilicon, tungsten, or metal. The source layer 10 may be a single layer or a multilayer. Alternatively, the source layer 10 may be a substrate including a source region. The interconnection structure 17 may be a bit line. The interconnection structure 17 may be formed in an insulating layer 18.

In the above-described structure, at least one source select transistor, a plurality of memory cells, and at least one drain select transistor may be coupled in series to form a single memory string. In addition, the memory string may be coupled between the source layer 10 and the bit line. The coupling of the memory string and the source layer 10 may be controlled by the source select transistor. The coupling of the memory string and the bit line may be controlled by the drain select transistor.

Select transistors and memory cells, included in a single memory string, may share the channel layer 14, and the channel layer 14 may be formed in a single layer. However, since operation performance is affected depending on the thickness of the channel layer 14, various conditions should be considered in adjusting the thickness of the channel layer 14.

An erase operation may be performed by a Gate Induced Drain Leakage (GIDL) current. The GIDL current may be generated in the source select transistor or the drain select transistor. A hole may be supplied to the channel layer 14 by using the GIDL current, and the hole may be injected into the data storage layer 13B of the memory cell by using the potential difference between the channel layer 14 and the word line WL. Accordingly, the thickness of the channel layer 14 should be great to generate a sufficient amount of GIDL current during the erase operation.

However, when the thickness of the channel layer 14 is great, swing characteristics of the transistor may deteriorate. In other words, turn-on and turn-off control of the select transistor and the memory cell may be difficult, which leads to deterioration of a cell distribution. On the contrary, when the thickness of the channel layer 14 is small, the GIDL current may decrease, and the erase operation may deteriorate. Accordingly, the reliability of the semiconductor device may suffer.

Accordingly, in an embodiment, a structure in which the single-layered channel layer 14 has the thicknesses varying, depending on a region, is proposed.

Referring to FIGS. 1A and 1B, the channel layer 14 may include a first region 14A, a second region 14B, and a third region 14C. The first region 14A may be adjacent to the source layer 10. The third region 14C may be adjacent to the interconnection structure 17, for example, the bit line. The second region 14B may be located between the first region 14A and the third region 14C. The first, second, and third regions 14A, 14B, and 14C may be coupled to form an integrated region and each of the first, second, and third regions 14A, 14B, and 14C may be a part of a single layer.

The first region 14A may correspond to the source select lines SSL, the second region 14B may correspond to the word lines WL, and the third region 14C may correspond to the drain select lines DSL. In other words, the first region 14A may be a channel region of the source select transistor, the second region 14B may be a channel region of the memory cell, and the third region 14C may be a channel region of the drain select transistor.

In an embodiment, when the erase operation is performed using the GIDL current, the GIDL current may be generated (hereinafter referred to as a GIDL region) in the first region 14A, the third region 14C, or both the first and third regions 14A and 14C. When the GIDL current is generated in both of the first and third regions 14A and 14C, the amount of GIDL current generated in both of the first and third regions 14A and 14C may differ or may be the same. The second region 14B may be a path where the hole moves.

Accordingly, the GIDL region of the channel layer 14 may selectively have a greater thickness to generate a sufficient amount of GIDL current compared to a region where the GIDL current is not generated. In addition, when the single channel layer 14 includes a plurality of GIDL regions, for example, first and third regions 14A and 14C, the thickness of the channel layer may depend on the amount of GIDL current that is generated. When the source select transistor generates a greater amount of GIDL current than the drain select transistor, the thickness D1 of the first region 14A may be greater than the thickness D2 of the second region 14B (D1>D2). The thickness D1 of the first region 14A may be greater than the thickness D2 of the third region 14C (D1>D2). The second region 14B and the third region 14C may have substantially the same thickness D2 or different thicknesses.

Each of the second and third regions 14B and 14C may have a smaller thickness than the first region 14A. Accordingly, the swing characteristics of the memory cell and/or the select transistor, corresponding to the second region 14B and/or the third region 14C, may be improved.

According to the structure as described above, the channel layer 14 may have a structure including a flat outer surface and a step-like inner surface.

A width of the gap-fill insulating layer 15 may vary according to the structure of the inner surface of the channel layer 14. The gap-fill insulating layer 15 may include a first region 15A, a second region 15B, and a third region 15C. In an embodiment, the first, second, and third regions 15A, 15B, and 15C may be coupled to form an integrated single layer. Alternatively, some of the first, second, and third regions 15A, 15B, and 15C may form different layers. However, an interface may exist between the different layers.

The first region 15A of the gap-fill insulating layer 15 may correspond to the first region 14A of the channel layer 14. Since the first region 14A has a relatively greater thickness, the first region 15A may have a relatively smaller width W1. The second region 15B of the gap-fill insulating layer 15 may correspond to the second region 14B of the channel layer 14. Since the second region 14B has a relatively smaller thickness, the second region 15B may have a relatively greater width W2. The third region 15C of the gap-fill insulating layer 15 may correspond to the third region 14C of the channel layer 14. Since the third region 14C has a relatively smaller thickness, the third region 15C may have a relatively greater width W2.

According to the structure as stated above, the single-layered channel layer 14 may be formed to have different thicknesses according to the region. The erase operation, as well as the swing characteristics of the transistor, may be improved by selectively increasing the thickness of the GIDL region of the single-layered channel layer 14.

Figure 2A:
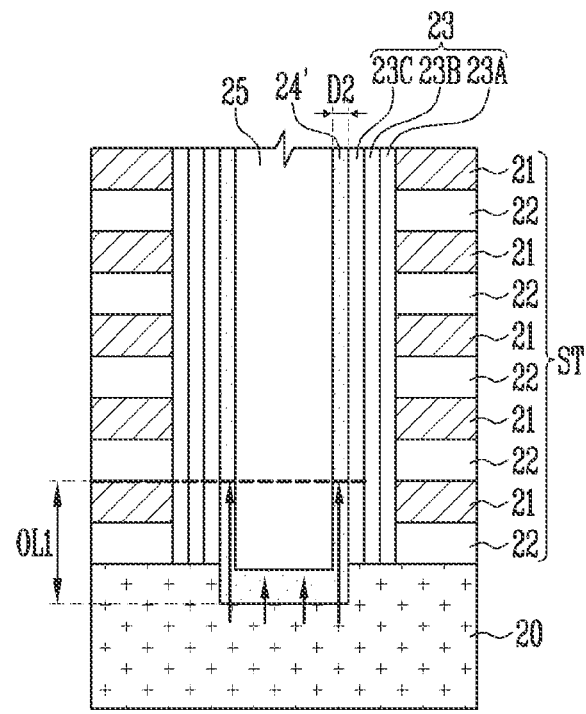
FIGS. 2A and 2B are cross-sectional diagrams, illustrating the structure of a semiconductor device, according to an embodiment.
Figure 2B:
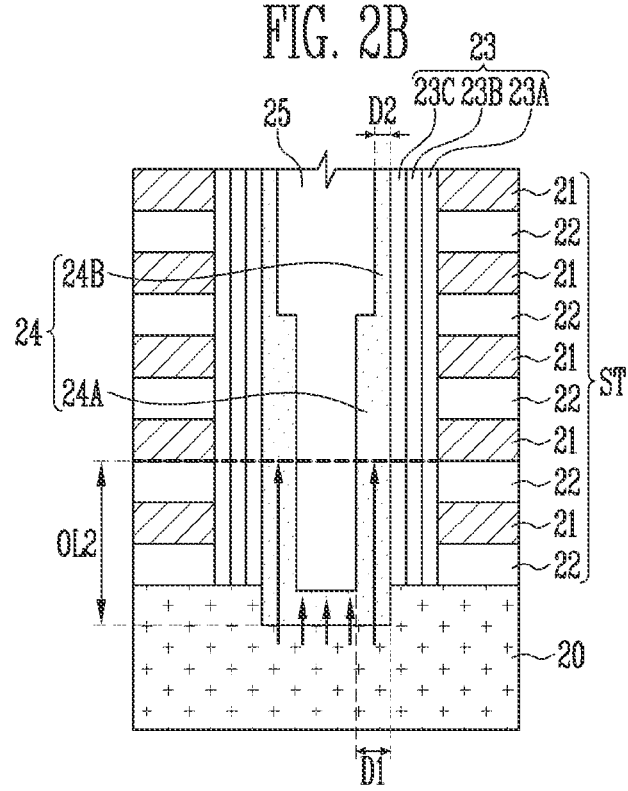

FIGS. 2A and 2B are cross-sectional diagrams, illustrating the structure of a semiconductor device, according to an embodiment and illustrate the relationship between the thickness of the channel layer 14 and the GIDL current. FIG. 2A illustrates an example in which the channel layer 24' has a uniform and small thickness D2. FIG. 2B illustrates an example in which the first region 24A of the channel layer 24 has the greater thickness D1 than the second region 24B of the channel layer 24.

Referring to FIGS. 2A and 2B, the semiconductor device may include the stacked structure ST, a source layer 20, a memory layer 23, a channel layer 24 and 24', a gap-fill insulating layer 25, and a conductive pad 26. The stacked structure ST may include conductive layers 21 and insulating layers 22 stacked alternately with each other. The memory layer 23 may include at least one of a charge blocking layer 23A, a data storage layer 23B, and a tunnel insulating layer 23C. The channel layer 24' and 24 may contact the source layer 20, and a dopant in the source layer 20 may be diffused into the channel layer 24' and 24 (please see arrows shown in FIG. 2A and FIG. 2B). A region into which the dopant is diffused may be a junction, and a first junction overlap OL1 and a second junction overlap OL2 may be shown in FIG. 2A and FIG. 2B, respectively.

The channel layer 24', shown in FIG. 2A, may have a uniform and small thickness D2 throughout the channel layer 24'. According to this example, the swing characteristics of the select transistors and the memory cells that share the corresponding channel layer 24' may be improved. However, since the GIDL region also has the small thickness D2, the dopant might not be sufficiently diffused. Accordingly, an area of the first junction overlap OL1 may be small and the GIDL current might not be sufficiently generated during the erase operation.

On the other hand, referring to FIG. 2B, a part of the channel layer 24 may have a greater thickness than the other part of the channel layer 24. The thickness D1 of the first region 24A may be greater than the thickness D2 of the second region 24B (D1>D2). According to this example, the dopant may be sufficiently diffused into the first region 24A where the GIDL current is generated. Accordingly, an area of the second junction overlap OL2 may be greater and the GIDL current may be sufficiently generated during the erase operation. In addition, since the memory cells of the second region 24B still have the small thickness D2 of the channel layer 24, the swing characteristics may still be improved.

Figure 3B:
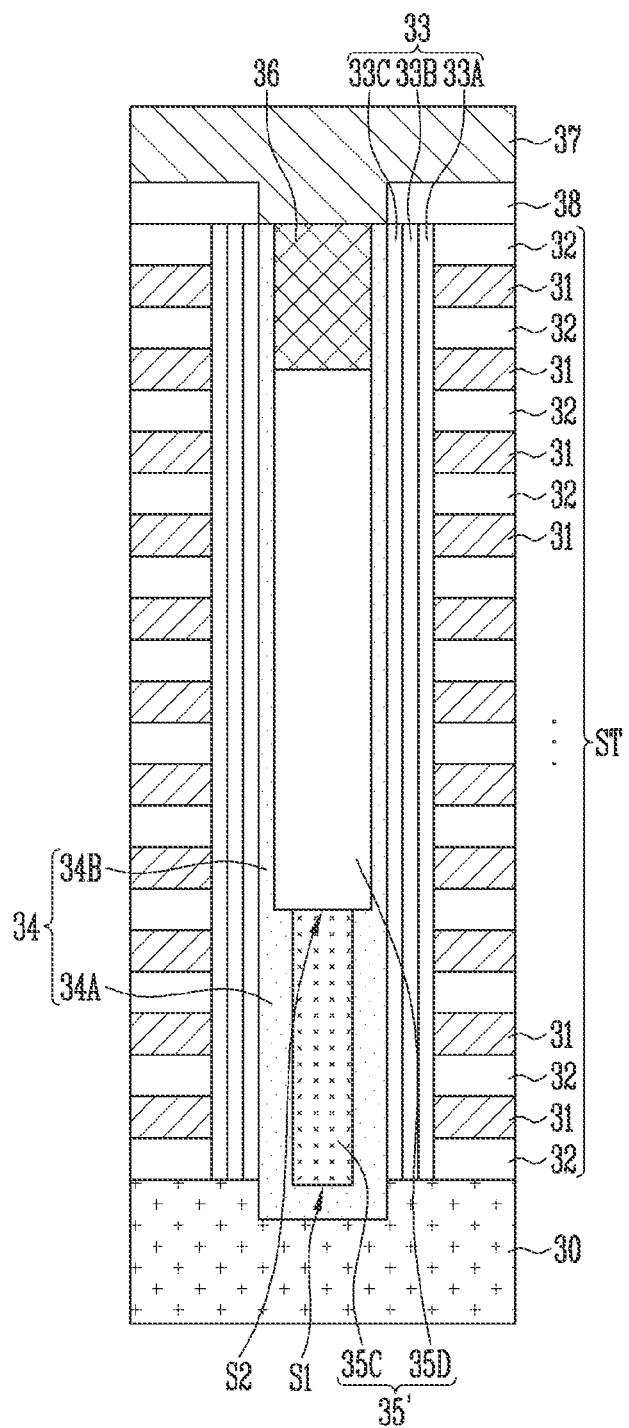
Figure 3C:
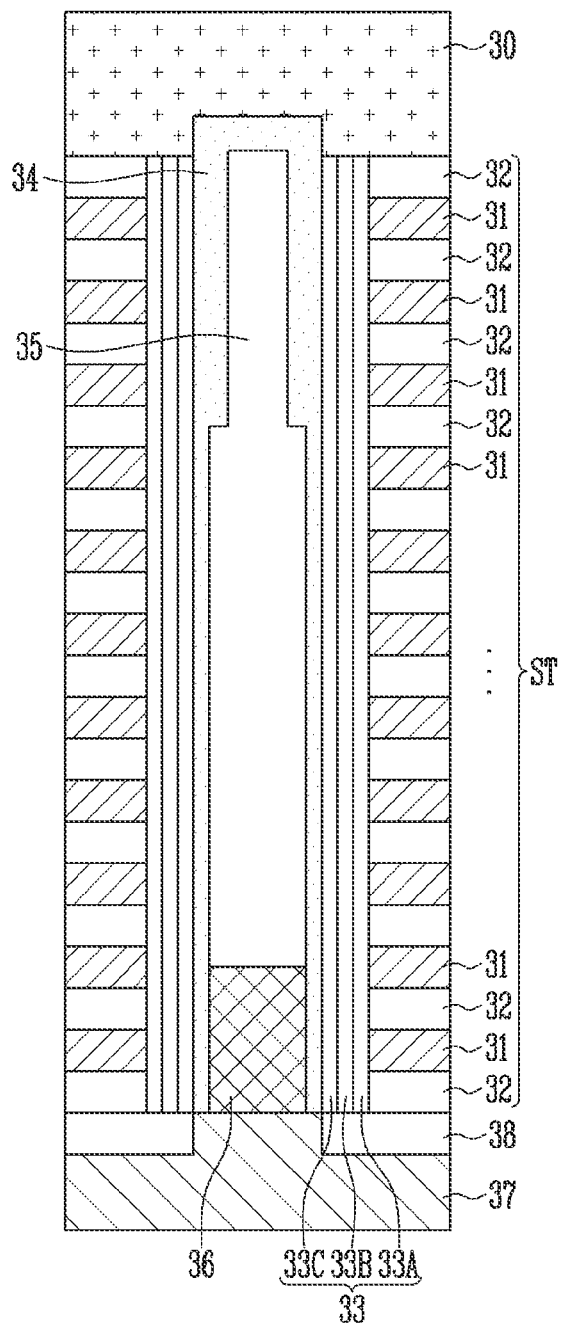

FIGS. 3A to 3C are cross-sectional diagrams, illustrating the structure of a semiconductor device, according to an embodiment. Each of FIGS. 3A, 3B, and 3C illustrates a modification of the channel structure. Hereinafter, any repetitive detailed description of components, already mentioned above, will be omitted.

Referring to FIG. 3A, the semiconductor device may include the stacked structure ST, a source layer 30, a memory layer 33, a channel layer 34, a gap-fill insulating layer 35, a conductive pad 36, a bit line 37, and an insulating layer 38. The stacked structure ST may include conductive layers 31 and insulating layers 32 alternately stacked with each other. The memory layer 33 may include at least one of a charge blocking layer 33A, a data storage layer 33B, and a tunnel insulating layer 33C.

The channel layer 34 may be a single layer including a first region 34A and a second region 34B. The thickness of the first region 34A may be greater than the thickness of the second region 34B.

The gap-fill insulating layer 35 may be formed in the channel layer 34 and may include a first gap-fill layer 35A and a second gap-fill layer 35B. The first gap-fill layer 35A may be formed in the first region 34A of the channel layer 34. The first gap-fill layer 35A may have a first surface S1 and a second surface S2. The first surface S1 may be adjacent to the source layer 30 and the second surface S2 may be adjacent to the bit line 37. In other words, the first surface S1 may be nearer to the source layer 30 than the bit line 37, and the second surface S2 may be nearer to the bit line 37 than the source layer 30. The first gap-fill layer 35A may include a groove G on the second surface S2, and the groove G may have a shape that has the width decrease, moving from the top of the first gap-fill layer 35A to the source layer 30. The second gap-fill layer 35B may be formed in the second region 34B of the channel layer 34. The second gap-fill layer 35B may include a protrusion filling the groove G of the first gap-fill layer 35A.

A material of the first gap-fill layer 35A may have etch selectivity with respect to the channel layer 34. The first gap-fill layer 35A may include an oxide, a nitride, organic matter, amorphous carbon, or the like. The channel layer 34 may be a polysilicon layer, and the first gap-fill layer 35A may be an oxide layer or a nitride layer. The second gap-fill layer 35B and the first gap-fill layer may be composed of the same material or of different materials. The second gap-fill layer 35B may include an insulating material such as an oxide.

Referring to FIG. 3B, a gap-fill insulating layer 35' may include a first gap-fill layer 35C and a second gap-fill layer 35D. Unlike the embodiment illustrated in FIG. 3A, the second surface S2 of the first gap-fill layer 35C may be flat, according to an embodiment shown in FIG. 3B. The second gap-fill layer 35D might not include a protrusion but may have a uniform width.

Referring to FIG. 3C, the source layer 30 may be located over the bit line 37. The stacked structure ST may be located on the bit line 37, and the source layer 30 may be located on the stacked structure ST. The gap-fill insulating layer 35 may have an upper portion having a smaller width than a lower portion.

The structures described above with reference to FIGS. 1A to 1C, 2A, 2B, and 3A to 3C are examples for explanation. However, the presently claimed invention is not limited thereto. The structures described above may be combined or changed within the intent of the present disclosure.

Figure 4:
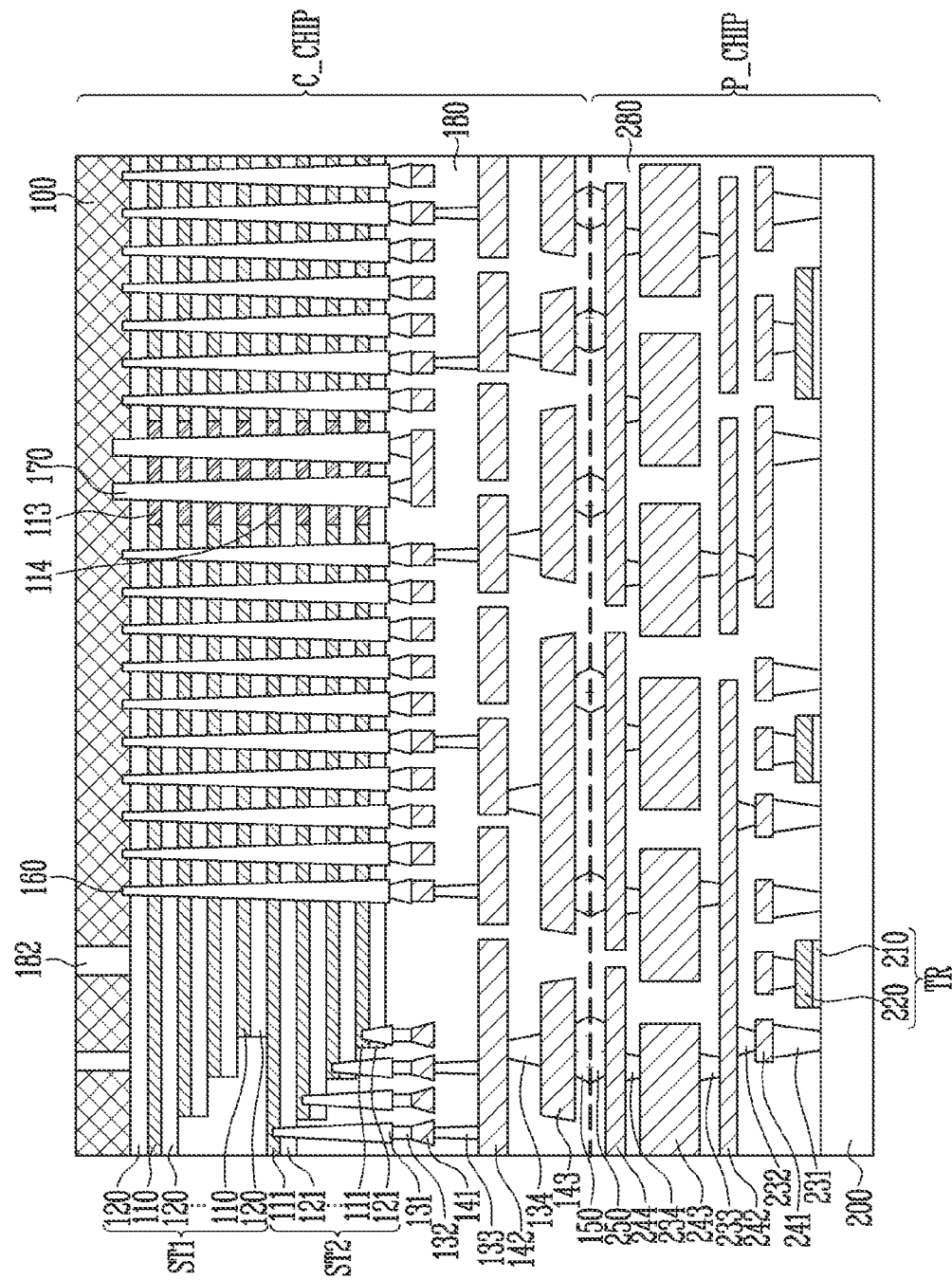
FIG. 4 is a cross-sectional diagram, illustrating the structure of a semiconductor device, according to an embodiment.

FIG. 4 is a cross-sectional diagram, illustrating the structure of a semiconductor device, according to an embodiment. Hereinafter, any repetitive detailed description of components already mentioned above will be omitted.

Referring to FIG. 4, the semiconductor device, according to an embodiment, may include a cell chip C_CHIP and a peripheral circuit chip P_CHIP, bonded to the cell chip C_CHIP. The cell chip C_CHIP may be located over the peripheral circuit chip P_CHIP or the peripheral circuit chip P_CHIP may be located over the cell chip C_CHIP.

The cell chip C_CHIP may include a source layer 100, a first stacked structure ST1, a second stacked structure ST2, an interconnection structure 131, 132, 133, 134, 141, 142, and 143, a first bonding structure 150, a channel structure 160, a source contact structure 170, and a first interlayer insulating layer 180.

The first stacked structure ST1 may include first conductive layers 110 and first insulating layers 120 alternately stacked with each other. The second stacked structure ST2 may include second conductive layers 111 and second insulating layers 121 alternately stacked with each other.

Some regions of the first stacked structure ST1 may include first sacrificial layers 113 instead of the first conductive layers 110. According to this example, the first sacrificial layers 113 and the first insulating layers 120 may be alternately stacked with each other in the regions. The second sacrificial layers 114 and the second insulating layers 121 may be alternately stacked with each other in some regions of the second stacked structure ST2. Each of the first and second sacrificial layers 113 and 114 may include a dielectric material such as a nitride.

The first stacked structure ST1 may include a cell region where memory strings are located and a contact region coupled to an interconnection structure. The second stacked structure ST2 may also include a cell region and a contact region. The contact region of each of the first and second stacked structures ST1 and ST2 may have a step-like shape.

The first stacked structure ST1 and the second stacked structure ST2 may be stacked in a vertical direction. For example, the first stacked structure ST1 may be located on the second stacked structure ST2. In addition, the cell region of the first stacked structure ST1 may overlap the cell region of the second stacked structure ST2 in a stacking direction. The contact region of the first stacked structure ST1 may overlap the contact region of the second stacked structure ST2 in the stacking direction.

The source layer 100 may be located on the first stacked structure ST1. The source layer 100 may be patterned and an insulating layer 182 may be filled between the neighboring source layers 100. The insulating layer 182 may be located to correspond to the contact region of each of the first and second stacked structures ST1 and ST2.

The channel structure 160 may pass through the first and second stacked structures ST1 and ST2. The channel structure 160 may be coupled to the source layer 100 and may protrude into the source layer 100. The channel structure 160 may include a channel layer, a memory layer, and a gap-fill insulating layer. The channel layer and the gap-fill insulating layer may have a structure consistent with the embodiments described above with reference to FIGS. 1A to 1C, 2A, 2B, and 3A to 3C.

The source contact structure 170 may pass through the first and second stacked structures ST1 and ST2 and may be coupled to the source layer 100. The source contact structure 170 may protrude farther into the source layer 100 than the channel structure 160. In addition, the source contact structure 170 may have a greater diameter than the channel structure 160.

The source contact structure 170 may pass through the first conductive layers 110, the first insulating layers 120, the second conductive layers 111, and the second insulating layers 121, or may pass through the first sacrificial layers 113, the first insulating layers 120, the second sacrificial layers 114, and the second insulating layers 121. The first sacrificial layers 113 may refer to the first sacrificial layers 113 which partially remain when the first sacrificial layers 113 are replaced with the first conductive layers 110. The second sacrificial layers 114 may refer to the second sacrificial layers 114 which partially remain when the second sacrificial layers 114 are replaced with the second conductive layers 111.

The source contact structure 170 may include a contact plug, and the contact plug may include a conductive material such as polysilicon, tungsten, or metal. In addition, the source contact structure 170 may further include an insulating spacer, surrounding a sidewall of the contact plug, and the insulating spacer may include an insulating material such as an oxide or a nitride.

The interconnection structure 131, 132, 133, 134, 141, 142, and 143 may include the contact plugs 131, 132, 133, and 134 and the wires 141, 142, and 143. The interconnection structure 131, 132, 133, 134, 141, 142, and 143 may be formed in the first interlayer insulating layer 180. Although FIG. 4 illustrates the first interlayer insulating layer 180 as a single layer, the first interlayer insulating layer 180 may include multiple insulating layers that are stacked.

The first contact plugs 131 may be coupled to the stacked first conductive layers 110 or the stacked second conductive layers 111 in a one-to-one manner. The second contact plugs 132 may be coupled to the first contact plugs 131, the channel structures 160, or the source contact structures 170. The second contact plugs 132 may electrically couple the first contact plugs 131 and the first wires 141. The third contact plugs 133 may be coupled to the first wires 141 and may electrically couple the first wires 141 and the second wires 142. The fourth contact plugs 134 may be coupled to the second wires 142 and may electrically couple the second wires 142 and the third wires 143.

The first bonding structure 150 may be provided to electrically couple the cell chip C_CHIP and the peripheral circuit chip P_CHIP. The first bonding structure 150 may have a shape of a contact plug, a wire, or the like. The first bonding structures 150 may be electrically coupled to the third wires 143.

The peripheral circuit chip P_CHIP may include a substrate 200, a transistor TR, an interconnection structure 231, 232, 233, 234, 241, 242, 243, and 244, a second bonding structure 250, and a second interlayer insulating layer 280.

The transistor TR may include a gate electrode 220 and a gate insulating layer 210. The gate insulating layer 210 may be interposed between the substrate 200 and the gate electrode 220. Although not illustrated in FIG. 4, the transistor TR may further include a junction in the substrate 200.

The interconnection structure 231, 232, 233, 234, 241, 242, 243 and 244 may include the contact plugs 231, 232, 233, and 234 and the wires 241, 242, 243, and 244. The interconnection structure 231, 232, 233, 234, 241, 242, 243, and 244 may be formed in the second interlayer insulating layer 280. Although FIG. 4 illustrates the second interlayer insulating layer 280 as a single layer, the second interlayer insulating layer 280 may include multiple insulating layers that are stacked.

The fifth contact plugs 231 may be coupled to the gate electrode 220 or a junction of the transistor TR. The fourth wires 241 may be electrically coupled to the fifth contact plugs 231. The sixth contact plugs 232 may electrically couple the fourth wires 241 to the fifth wires 242. The seventh contact plugs 233 may electrically couple the fifth wires 242 to the sixth wires 243. The eighth contact plugs 234 may electrically couple the sixth wires 243 to the seventh wires 244.

The second bonding structure 250 may be provided to electrically couple the cell chip C_CHIP to the peripheral circuit chip P_CHIP. The second bonding structure 250 may have a shape of a contact plug, a wire, or the like. The second bonding structures 250 may be electrically coupled to the seventh wires 244. The second bonding structures 250 may contact the first bonding structures 150 of the cell chip C_CHIP. Accordingly, the cell chip C_CHIP and the peripheral circuit chip P_CHIP may be electrically coupled through the first and second bonding structures 150 and 250. For example, the cell chip C_CHIP and the peripheral circuit chip P_CHIP may be coupled by bonding the first bonding structures 150 and the second bonding structures 250 and bonding the first interlayer insulating layer 180 and the second interlayer insulating layer 280. Accordingly, the first and second stacked structures ST1 and ST2 may be located between the substrate 200 and the source layer 100.

According to the structure as described above, after the cell chip C_CHIP and the peripheral circuit chip P_CHIP are separately manufactured, the cell chip C_CHIP and the peripheral circuit chip P_CHIP may be bonded together. In addition, the swing characteristics of the transistor as well as the erase operation may be improved by partially increasing the thickness of the channel layer included in the channel structure 160.

FIGS. 5A to 5G are cross-sectional diagrams, illustrating a method of manufacturing a semiconductor device, according to an embodiment. Hereinafter, any repetitive detailed description of components already mentioned above will be omitted.

Referring to FIG. 5A, the stacked structure ST may be formed on a base. The base may include a source structure, an interconnection, a peripheral circuit, and the like. The source structure may include a substrate including a source region, a source layer, a sacrificial layer for source, and the like. For example, the source structure may be a multilayer in which at least one source layer and at least one sacrificial layer are stacked. The embodiment in which the stacked structure ST is formed on a source structure 40 will be described.

The stacked structure ST may include first material layers 41 and second material layers 42 which are alternately stacked on each other. The first material layers 41 may be provided to form gate electrodes of a memory cell, a select transistor, or the like. The second material layers 42 may be provided to insulate the stacked gate electrodes from each other. The first material layers 41 may include a material having high etch selectivity with respect to the second material layers 42. In FIG. 5A, the embodiment in which the first material layers 41 are sacrificial layers and the second material layers 42 are insulating layers is illustrated. However, the presently claimed invention is not limited thereto. For example, the first material layers 41 may be sacrificial layers including a nitride, or the like, and the second material layers 42 may be insulating layers including an oxide, or the like. Alternatively, the first material layers 41 may be conductive layers including polysilicon, tungsten, or the like, and the second material layers 42 may be insulating layers including an oxide, or the like. In another example, the first material layers 41 may be conductive layers including doped polysilicon, or the like, and the second material layers 42 may be sacrificial layers including undoped polysilicon, or the like.

Subsequently, an opening OP passing through the stacked structure ST may be formed. The opening OP may expose the source structure 40 or pass through at least a portion of the source structure 40.

Subsequently, a memory layer 43 may be formed in the opening OP. The memory layer 43 may include at least one of a charge blocking layer 43A, a data storage layer 43B, and a tunnel insulating layer 43C.

Subsequently, a channel layer 44 may be formed in the opening OP. When the memory layer 43 is formed before the channel layer 44 is formed, the channel layer 44 may be formed in the memory layer 43. According to the embodiment shown in FIG. 5A, an outer surface of the channel layer 44 may be in contact with the memory layer 43. For example, the outer surface of the channel layer 44 may be in contact with the inner surface of the tunnel insulating layer 43C. The channel layer 44 may have a thickness D3 which does not completely fill the opening OP.

Although FIG. 5A illustrates the embodiment in which the memory layer 43 surrounds a sidewall and a bottom surface of the channel layer 44, the memory layer 43 may have the shape of a spacer and surround only the sidewall of the channel layer 44. For example, a surface of the source structure 40 may be exposed by etching a region, which is formed at a bottom surface of the opening OP, of the memory layer 43, using a blanket etching process. Subsequently, the channel layer 44 may be in direct contact with the source structure 40 by forming the channel layer 44 in the opening OP. In addition, the channel layer 44 may be formed after an epitaxial semiconductor grown from the exposed source structure 40 is formed.

The channel layer 44 may be a semiconductor layer including silicon (Si), germanium (Ge), or the like. For example, a polysilicon layer may be formed by forming an amorphous silicon layer and then crystallizing the amorphous silicon layer with a heat treatment process. Accordingly, the channel layer 44, including a single layer of polysilicon, may be formed.

The channel layer 44 may be a single layer including a first region A, a second region B, and a third region C. The first region A may be a GIDL region, the second region B may be a cell region, and the third region C may be a GIDL region. A range of the first region A may vary according to the number of source select lines included in the corresponding stacked structure ST. A range of the third region C may vary according to the number of drain select lines included in the corresponding stacked structure ST. A range of the second region B may vary according to the number of word lines included in the corresponding stacked structure ST.

Referring to FIG. 5B, a channel layer 44A may be etched by a primary etching. The channel layer 44A may be etched using an isotropic etching process. For example, an inner surface of the channel layer 44A may be etched using a wet etching process, such that the entire channel layer 44A may have a reduced thickness D4. The thickness of the GIDL region of the channel layer 44A may be determined by the primary etching. Accordingly, the primary etching may be omitted such that the GIDL region maintains sufficient thickness.

Figure 5C:
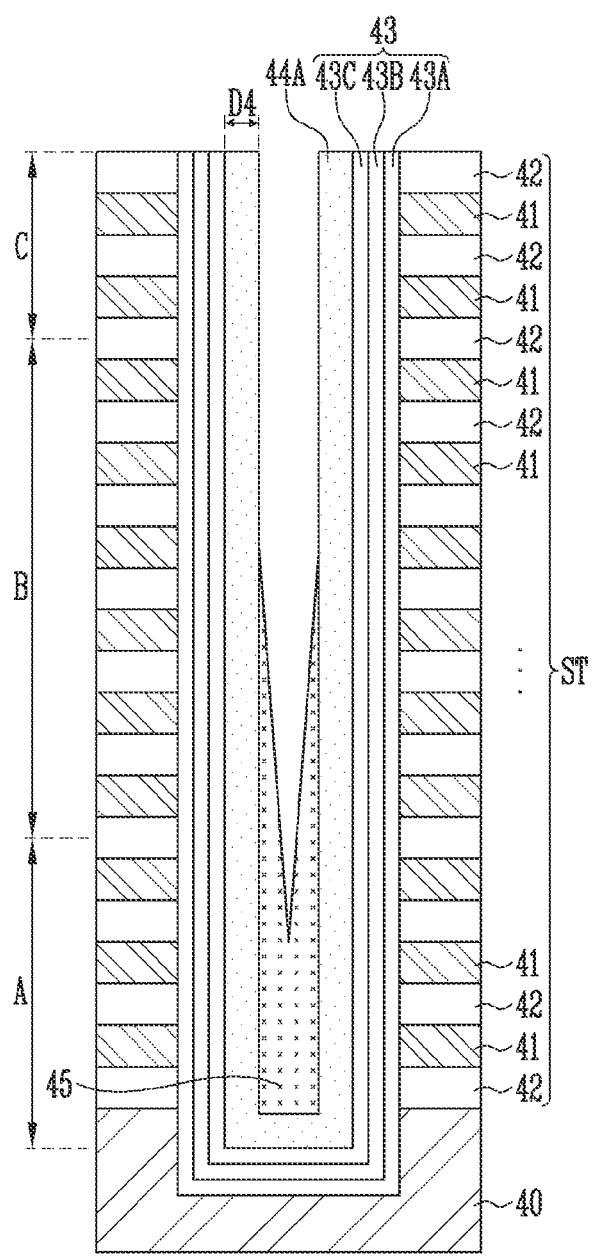

Referring to FIG. 5C, a sacrificial layer 45 may be formed in the opening OP. The sacrificial layer 45 may partially fill the opening OP. For example, the sacrificial layer 45 may be formed to partially fill the opening OP by being initially filled from the bottom surface of the channel layer 44A.

The sacrificial layer 45 may be formed by a bottom-up filling method in which the opening OP is filled from the bottom surface thereof. For example, a deposition process for depositing a sacrificial material and a surface treatment process for suppressing deposition at an upper surface of the opening OP may be repeatedly performed. The deposition process may be performed by an Atomic Layer Deposition (ALD) method. The surface treatment process may be performed using plasma. Nucleation at the upper surface of the opening OP may be suppressed by plasma. Accordingly, the sacrificial layer 45 covering the first region A of the channel layer 44A and exposing the second and third regions B and C of the channel layer 44A may be formed. Alternatively, the sacrificial layer 45, covering the first region A of the channel layer 44A with a thick layer and covering the second and third regions B and C of the channel layer 44A with a thin layer, may be formed.

Figure 5D:
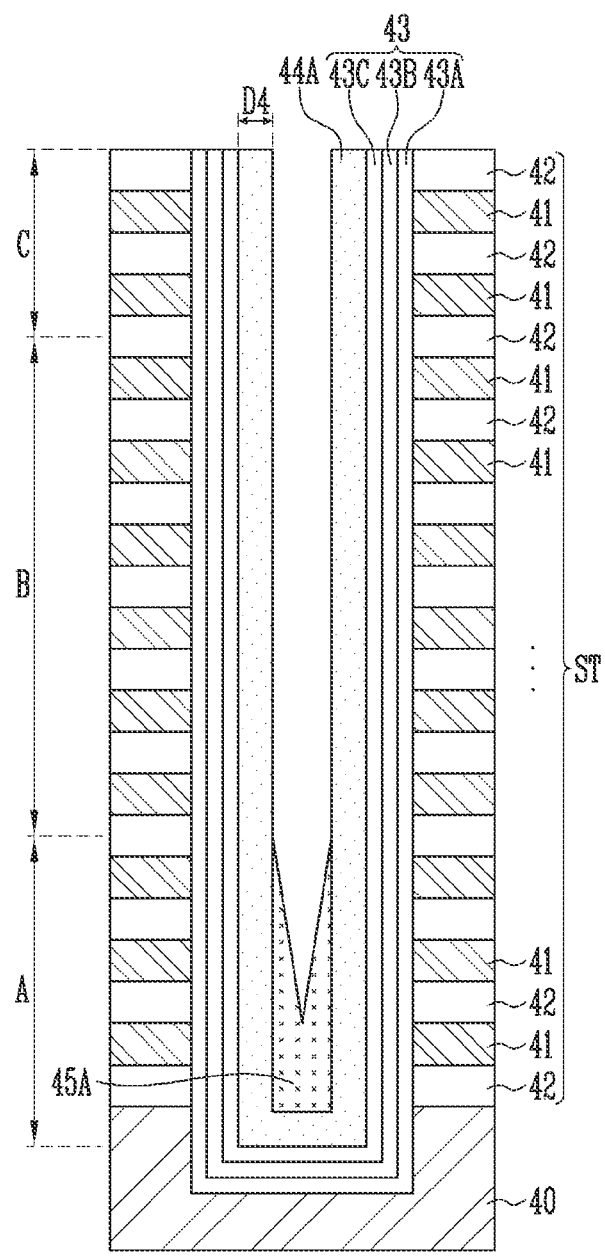

When the sacrificial layer 45 may be formed at the second region B or the third region C, a process for exposing the second region B and the third region C may be further performed. Referring to FIG. 5D, a sacrificial layer 45A may be etched to expose the second region B and the third region C. For example, the sacrificial layer 45A may be selectively etched using a wet etching process. Accordingly, the sacrificial layer 45A covering the first region A of the channel layer 44A and exposing the second region B and the third region C of the channel layer 44A may be formed. Referring to FIG. 5E, a channel layer 44B may be etched by a secondary etching using the sacrificial layer 45A as an etching barrier. For example, the channel layer 44B may be etched to decrease a thickness of the channel layer 44B. The channel layer 44B may be etched using an isotropic etching process. The channel layer 44B may be etched using a wet etching process. The second region B and the third region C exposed by the sacrificial layer 45A may be etched and the first region A might not be etched. Accordingly, the first region A may have the thickness D4 and each of the second region B and the third region C may have a thickness D5 smaller than the thickness D4.

Referring to FIG. 5F, a gap-fill insulating layer 46 may be formed in the opening OP. The sacrificial layer 45A may be removed before the gap-fill insulating layer 46 is formed. When the sacrificial layer 45A is not removed, the remaining sacrificial layer 45A may serve as a gap-fill layer.

Figure 5G:
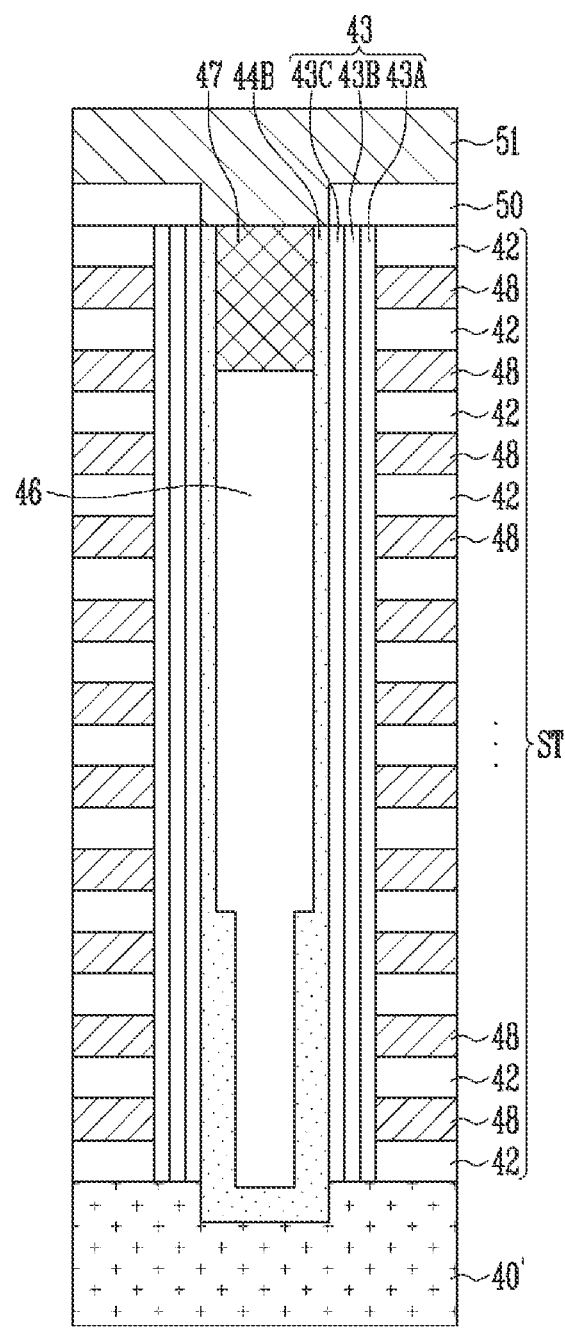

Referring to FIG. 5G, after the gap-fill insulating layer 46 is etched, a conductive pad 47 may be formed in a region from which the gap-fill insulating layer 46 is etched. Subsequently, the first material layers 41 or the second material layers 42 may be replaced by third material layers 48. For example, when the first material layers 41 are sacrificial layers and the second material layers 42 are insulating layers, the first material layers 41 may be replaced by conductive layers. Alternatively, when the first material layers 41 are conductive layers and the second material layers 42 are insulating layers, the first material layers 41 may be silicidized. As a further alternative, when the first material layers 41 are conductive layers and the second material layers 42 are sacrificial layers, the second material layers 42 may be replaced by insulating layers.

In addition, depending on the material of the source structure 40, an additional process to directly couple the source structure 40 to the channel layer 44B may be performed. The additional process may be performed before or after replacing the first material layers 41 or the second material layers 42 by the third material layers 48. First, an opening, exposing the memory layer 43, may be formed by removing the sacrificial layer included in the source structure 40. Subsequently, the channel layer 44B may be exposed in the opening by removing the exposed memory layer 43. Then, a source layer may be formed in the opening. Accordingly, the sacrificial layer in the source structure 40 may be replaced by the source layer and a source structure 40' directly coupled to the channel layer 44B may be formed.

Subsequently, an interconnection structure, coupled to the channel layer 44B, may be formed. For example, a bit line 51, coupled to the channel layer 44B, may be formed over the stacked structure ST. The bit line 51 may be formed in an interlayer insulating layer 50.

The manufacturing method, described above, with reference to FIGS. 5A to 5G, may be applied when the cell chip C_CHIP, described above, with reference to FIG. 4, is manufactured. Accordingly, the peripheral circuit chip P_CHIP, manufactured by a separate process, may be formed, and a process for bonding the cell chip C_CHIP and the peripheral circuit chip P_CHIP may be additionally performed.

According to the manufacturing method as described above, the channel layer 44B may be formed to have a single-layered structure having different thicknesses depending on the region. For example, the thicknesses of the channel layer 44B may be readily adjusted by the region and by selectively etching some regions of the channel layer 44B by using the sacrificial layer 45A.

Figure 6A:
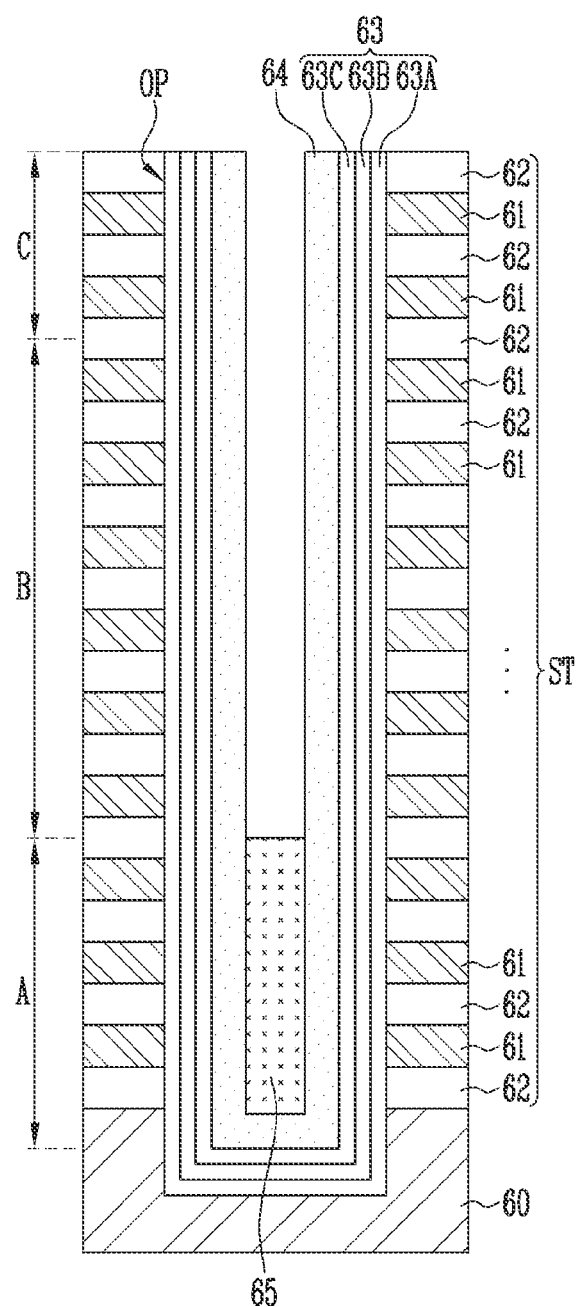
FIGS. 6A and 6B are diagrams, illustrating a method of manufacturing a semiconductor device, according to an embodiment.
Figure 6B:
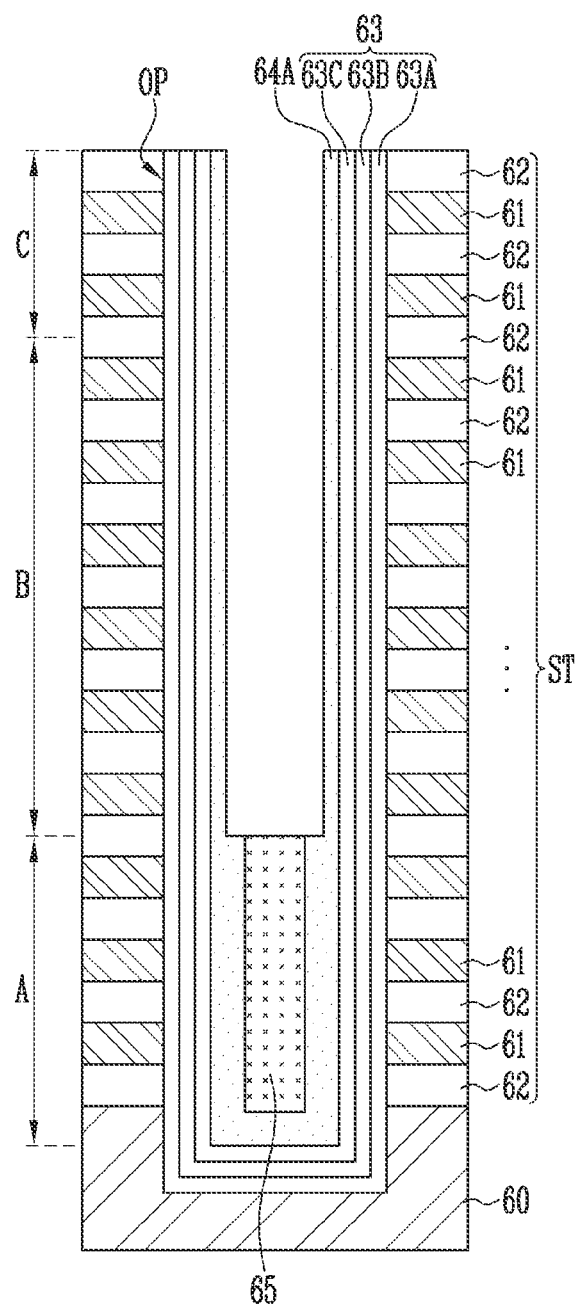

FIGS. 6A and 6B are diagrams, illustrating a method of manufacturing a semiconductor device, according to an embodiment. Hereinafter, any repetitive detailed description of components already mentioned above will be omitted.

Referring to FIG. 6A, the stacked structure ST may be formed on a source structure 60. The stacked structure ST may include first material layers 61 and second material layers 62, which are alternately stacked with each other. Subsequently, after the opening OP passing through the stacked structure ST is formed, a memory layer 63 may be formed in the opening OP. The memory layer 63 may include a charge blocking layer 63A, a data storage layer 63B, and a tunnel insulating layer 63C. Subsequently, a channel layer 64 may be formed in the memory layer 63.

Subsequently, a sacrificial layer 65 may be formed in the channel layer 64. The sacrificial layer 65 may fill the channel layer 64 from the bottom surface thereof to the top portion of the first region A. For example, a flowable material may be formed in the opening OP. Subsequently, the sacrificial layer 65 may be formed by densifying the flowable material by a heat treatment process. The flowable material may be an oxide, a Spin On Glass (SOG) material, or the like. Due to the characteristics of the flowable material, the flowable material may fill a lower portion of the opening OP and have a structure having a flat upper surface.

Referring to FIG. 6B, a channel layer 64A may be etched using the sacrificial layer 65 as an etching barrier. The second region B and the third region C exposed by the sacrificial layer 65 may be etched by a predetermined thickness and the first region A covered by the sacrificial layer 65 might not be etched. A subsequent process such as forming a gap-fill insulating layer may be performed.

According to the process described above, the sacrificial layer 65 may be formed by using the flowable material and filling the opening OP from the bottom surface thereof. Accordingly, the sacrificial layer 65 having a desired height may be easily formed.

Figure 7:
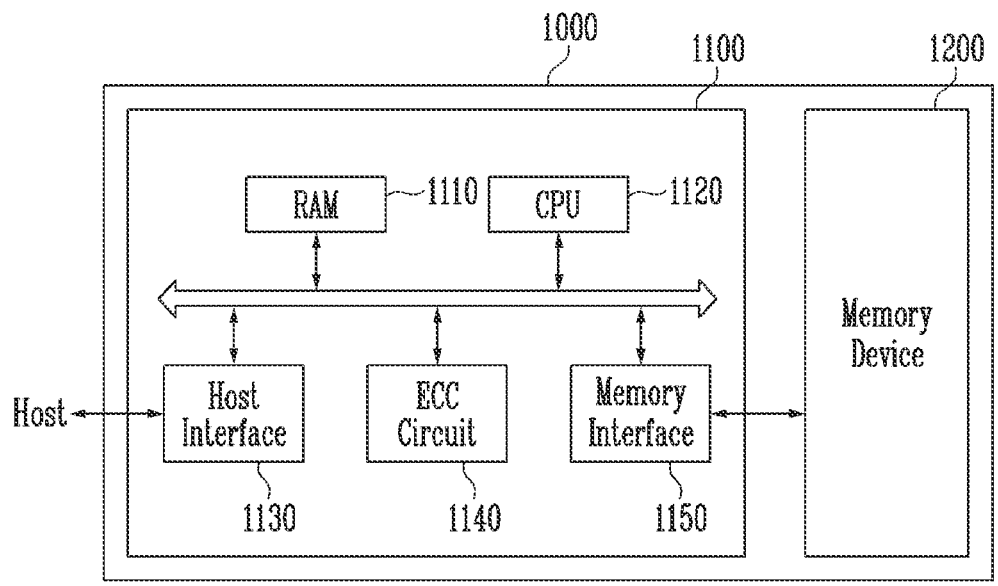
FIGS. 7 and 8 are block diagrams, illustrating the configuration of a memory system, according to an embodiment.

FIG. 7 is a block diagram, illustrating the configuration of a memory system 1000, according to an embodiment.

Referring FIG. 7, the memory system 1000, according to an embodiment, may include a memory device 1200 and a controller 1100.

The memory device 1200 may be used to store data information having various data formats such as a text format, a graphical format, and a software code format. The memory device 1200 may be a non-volatile memory device. Furthermore, the memory device 1200 may have a structure consistent with the embodiments described above with reference to FIGS. 1A to 6B, and may be manufactured by a manufacturing method consistent with the embodiments described above with reference to FIGS. 1A to 6B. According to an embodiment, the memory device 1200 may include a stacked structure including conductive layers and insulating layers alternately stacked with each other, a channel layer passing through the stacked structure, and a gap-fill insulating layer in the channel layer. The channel layer may be a single layer including a first GIDL region, a cell region, and a second GIDL region. The first GIDL region may have a greater thickness than each of the cell region and the second GIDL region. Since the memory device 1200 is configured and manufactured in the same manner as described above, a detailed description thereof will be omitted.

The controller 1100 may be coupled to a host and the memory device 1200 and configured to access the memory device 1200 in response to a request from the host. For example, the controller 1100 may control read, write, erase, and background operations of the memory device 1200.

The controller 1100 may include Random Access Memory (RAM) 1110, a Central Processing Unit (CPU) 1120, a host interface 1130, an Error Correction Code (ECC) circuit 1140, a memory interface 1150, and the like.

The RAM 1110 may be used as an operation memory of the CPU 1120, a cache memory between the memory device 1200 and the host, a buffer memory between the memory device 1200 and the host, or the like. The RAM 1110 may be replaced with Static Random Access Memory (SRAM), Read Only Memory (ROM), or the like.

The CPU 1120 may control the overall operation of the controller 1100. For example, the CPU 1120 may operate firmware such as a Flash Translation Layer (FTL) stored in the RAM 1110.

The host interface 1130 may interface with the host. For example, the controller 1100 may communicate with the host through at least one of various interface protocols such as a Universal Serial Bus (USB) protocol, a MultiMedia Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, and an Integrated Drive Electronics (IDE) protocol, a private protocol, and the like.

The ECC circuit 1140 may use an Error Correction Code (ECC) to detect and correct errors in data read from the memory device 1200.

The memory interface 1150 may interface with the memory device 1200. For example, the memory interface 1150 may include a NAND interface or a NOR interface.

The controller 1100 may further include a buffer memory (not shown) for temporarily storing data. The buffer memory may be used to temporarily store data to be transferred to an external device through the host interface 1130 or data to be transferred from the memory device 1200 through the memory interface 1150. The controller 1100 may further include ROM which stores code data to interface with the host.

Since the memory system 1000 according to the embodiment includes the memory device 1200 having improved integration density and characteristics, the memory system 1000 may also have improved integration density and characteristics accordingly.

Figure 8:
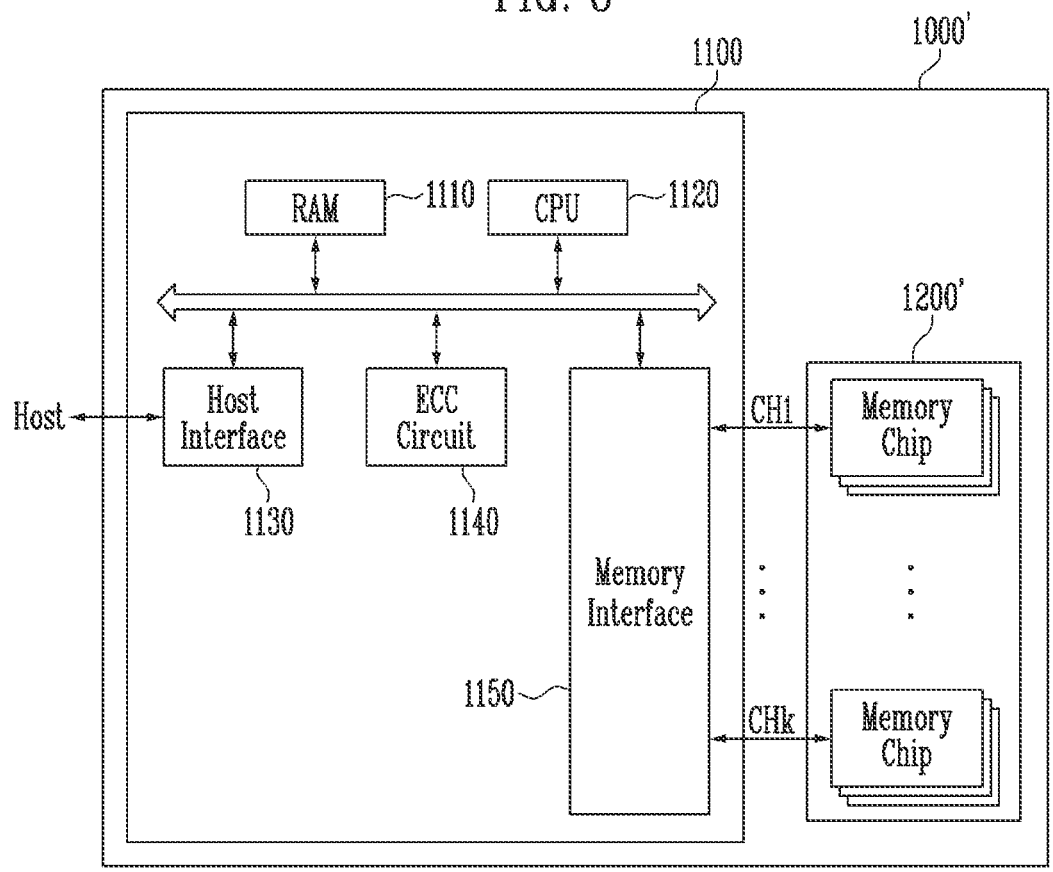

FIG. 8 is a block diagram, illustrating the configuration of a memory system 1000', according to an embodiment. Hereinafter, any repetitive detailed description of components already mentioned above will be omitted.

Referring to FIG. 8, the memory system 1000', according to an embodiment, may include a memory device 1200' and the controller 1100. The controller 1100 may include the RAM 1110, the CPU 1120, the host interface 1130, the ECC circuit 1140, the memory interface 1150, and the like.

The memory device 1200' may be a non-volatile memory device. Furthermore, the memory device 1200' may have a structure consistent with the embodiments described above with reference to FIGS. 1A to 6B, and may be manufactured by a manufacturing method consistent with the embodiments described above with reference to FIGS. 1A to 6B. According to an embodiment, the memory device 1200' may include a stacked structure including conductive layers and insulating layers alternately stacked with each other, a channel layer passing through the stacked structure, and a gap-fill insulating layer in the channel layer. The channel layer may be a single layer including a first GIDL region, a cell region, and a second GIDL region. The first GIDL region may have a greater thickness than each of the cell region and the second GIDL region. Since the memory device 1200' is configured and manufactured in the same manner as described above, a detailed description thereof will be omitted.

Furthermore, the memory device 1200' may be a multi-chip package including a plurality of memory chips. The plurality of memory chips may be divided into a plurality of groups which may communicate with the controller 1100 through first to kth channels CH1 to CHk. In addition, memory chips, included in a single group, may be suitable for communicating with the controller 1100 through a common channel. The memory system 1000' may be modified so that a single memory chip may be coupled to a single channel.

Since the memory system 1000' according to the embodiment includes the memory device 1200' having improved integration density and characteristics, the integration density and characteristics of the memory system 1000' may also be improved. In addition, since the memory device 1200' is formed into a multi-chip package, data storage capacity and driving speed of the memory system 1000' may be further increased.

Figure 9:
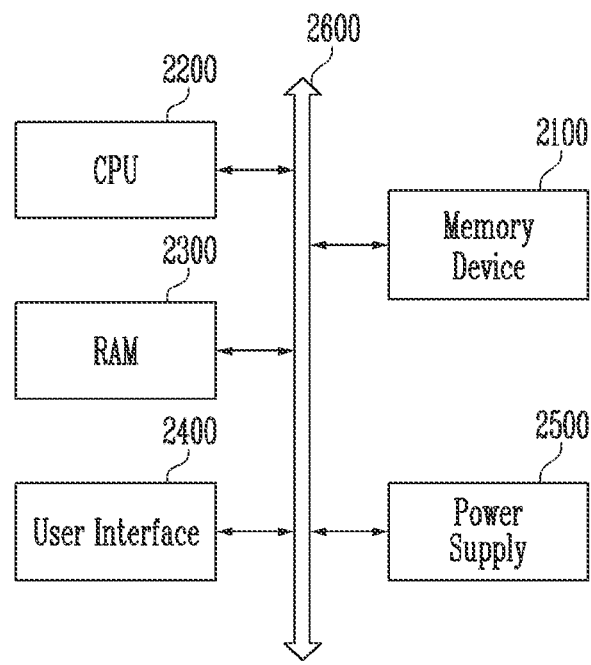
FIGS. 9 and 10 are block diagrams, illustrating the configuration of a computing system, according to an embodiment.

FIG. 9 is a block diagram, showing the configuration of a computing system 2000, according to an embodiment. Hereinafter, any repetitive detailed description of components already mentioned above will be omitted.

Referring to FIG. 9, the computing system 2000, according to an embodiment, may include a memory device 2100, a CPU 2200, RAM 2300, a user interface 2400, a power supply 2500, a system bus 2600, and the like.

The memory device 2100 may store data provided via the user interface 2400, data processed by the CPU 2200, and the like. The memory device 2100 may be electrically coupled to the CPU 2200, the RAM 2300, the user interface 2400, and the power supply 2500 by the system bus 2600. For example, the memory device 2100 may be coupled to the system bus 2600 via a controller (not shown), alternatively, directly coupled to the system bus 2600. When the memory device 2100 is directly coupled to the system bus 2600, functions of the controller may be performed by the CPU 2200, the RAM 2300, or the like.

The memory device 2100 may be a non-volatile memory. Furthermore, the memory device 2100 may have a structure consistent with the embodiments described above with reference to FIGS. 1A to 6B, and may be manufactured by a manufacturing method consistent with the embodiments described above with reference to FIGS. 1A to 6B. According to an embodiment, the memory device 2100 may include a stacked structure including conductive layers and insulating layers alternately stacked with each other, a channel layer passing through the stacked structure, and a gap-fill insulating layer in the channel layer. The channel layer may be a single layer including a first GIDL region, a cell region, and a second GIDL region. The first GIDL region may have a greater thickness than each of the cell region and the second GIDL region. Since the memory device 2100 is configured and manufactured in the same manner as described above, a detailed description thereof will be omitted.

As described above with reference to FIG. 8, the memory device 2100 may be a multi-chip package configured with a plurality of memory chips.

The computing system 2000 having the above-described configuration may be provided as one of various elements of an electronic device such as a computer, an Ultra Mobile PC (UMPC), a workstation, a net-book, a Personal Digital Assistant (PDA), a portable computer, a web tablet, a wireless phone, a mobile phone, a smartphone, an e-book, a Portable Multimedia Player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, an RFID device, or the like.

As described above, since the computing system 2000 according to the embodiment includes the memory device 2100 having improved integration density and characteristics, the characteristics of the computing system 2000 may also be improved.

Figure 10:
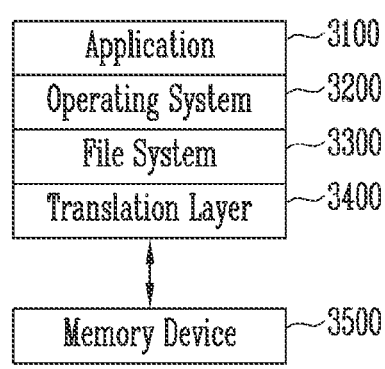

FIG. 10 is a block diagram, illustrating a computing system 3000, according to an embodiment.

Referring to FIG. 10, the computing system 3000, according to an embodiment, may include a software layer that has an operating system 3200, an application 3100, a file system 3300, and a translation layer 3400. Furthermore, the computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data to be stored in the memory device 3500 according to given rules. The file system 3300 may be determined depending on the operating system 3200 used in the computing system 3000. For example, when the operating system 3200 is a Microsoft Windows-based system, the file system 3300 may be a File Allocation Table (FAT), an NT file system (NTFS), or the like. In addition, when the operating system 3200 is a Unix/Linux-based system, the file system 3300 may be an extended file system (EXT), a Unix File System (UFS), a Journaling File System (JFS), or the like.

FIG. 10 illustrates the operating system 3200, the application 3100, and the file system 3300 in separate blocks.

However, the application 3100 and the file system 3300 may be included in the operating system 3200.

The translation layer 3400 may translate an address into a suitable form for the memory device 3500 in response to a request from the file system 3300. For example, the translation layer 3400 may translate a logical address, generated by the file system 3300, into a physical address of the memory device 3500. Mapping information of the logical address and the physical address may be stored in an address translation table. For example, the translation layer 3400 may be a Flash Translation Layer (FTL), a Universal Flash Storage Link Layer (ULL), or the like.

The memory device 3500 may be a non-volatile memory. Furthermore, the memory device 3500 may have a structure consistent with the embodiments described above with reference to FIGS. 1A to 6B, and may be manufactured by a manufacturing method consistent with the embodiments described above with reference to FIGS. 1A to 6B. According to an embodiment, the memory device 3500 may include a stacked structure including conductive layers and insulating layers alternately stacked with each other, a channel layer passing through the stacked structure, and a gap-fill insulating layer in the channel layer. The channel layer may be a single layer including a first GIDL region, a cell region, and a second GIDL region. The first GIDL region may have a greater thickness than each of the cell region and the second GIDL region. Since the memory device 3500 is configured and manufactured in the same manner as described above, a detailed description thereof will be omitted.

The computing system 3000 having the above-described configuration may be divided into an operating system layer that is operated in an upper level region and a controller layer that is operated in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to the embodiment includes the memory device 3500 having improved integration density and characteristics, the characteristics of the computing system 3000 may also be improved.

According to embodiments, a semiconductor device having a stabilized structure and improved reliability may be provided. In addition, a method of manufacturing a semiconductor device may be simplified with a lower level of difficulty of processes and lower manufacturing costs.

Embodiments have been disclosed herein, and although specific terms are employed, they are used and are to be interpreted in a generic and descriptive sense only and not for the purpose of limitation. Accordingly, it will be understood by a person of ordinary skill in the art to which the invention pertains that various changes in forms and details may be made without departing from the spirit and scope of the invention as set forth in the following claims.

What is claimed is:

1. A method of manufacturing a semiconductor device, the method comprising:
   forming a stacked structure including at least one source select line, a plurality of word lines and at least one drain select line;
   forming an opening, passing through the stacked structure;
   forming a channel layer in the opening, the channel layer including a first region corresponding to the source select line, a cell region and a second region corresponding to the drain select line;
   forming a sacrificial layer in the channel layer; and
   etching the cell region and the second region of the channel layer by using the sacrificial layer as an etching barrier.

2. The method of claim 1, wherein the sacrificial layer covers the first region of the channel layer and leaves the cell region and the second region of the channel layer exposed.

3. The method of claim 1, wherein the forming of the sacrificial layer comprises:
   forming a sacrificial material covering the first region and the cell region; and
   forming the sacrificial layer by etching the sacrificial material to expose the cell region and the second region.

4. The method of claim 3, wherein a thickness of the sacrificial material, deposited on the first region, is greater than a thickness of the sacrificial material deposited on each of the cell region and the second region.

5. The method of claim 3, wherein the sacrificial material is formed by an Atomic Layer Deposition method.

6. The method of claim 1, wherein the sacrificial layer is formed in the channel layer by filling the channel layer from a bottom surface to cover the first region.

7. The method of claim 6, wherein the sacrificial layer includes a flowable oxide layer.

8. The method of claim 1, further comprising forming a gap-fill insulating layer in the channel layer of which the cell region and the second region are etched.

9. The method of claim 8, further comprising:
   etching the gap-fill insulating layer; and
   forming a conductive pad at a region from which the gap-fill insulating layer is etched.

10. The method of claim 1, further comprising etching the channel layer to decrease a thickness of the channel layer, before the sacrificial layer is formed.

11. A method of manufacturing a semiconductor device, the method comprising:
    forming a stacked structure including at least one source select line, a plurality of word lines and at least one drain select line;
    forming an opening, passing through the stacked structure;
    forming a single layer of polysilicon in the opening, the single layer of polysilicon including a first region and a second region, wherein the first region corresponds to the source select line and the second region corresponds to the drain select line;
    forming a sacrificial layer in the single layer of polysilicon;
    etching the second region of the single layer of polysilicon by using the sacrificial layer as an etching barrier; and
    forming a gap-fill insulating layer in the single layer of polysilicon after the second region is etched.

12. The method of claim 11,
    wherein the single layer of polysilicon is coupled between the source layer and the bit line.

13. The method of claim 12, wherein the first region is adjacent to the source layer and the second region is adjacent to the bit line, and
    wherein the first region has a greater thickness than the second region.

14. The method of claim 11, wherein the first region is a region where a gate induced drain leakage (GIDL) current is generated during an erase operation.

15. The method of claim 11, wherein the sacrificial layer covers the first region of the single layer of polysilicon and leaves the second region of the single layer of polysilicon exposed.

16. The method of claim 11, wherein the forming of the sacrificial layer comprises:
   forming a sacrificial material covering the first region and the second region; and
   forming the sacrificial layer by etching the sacrificial material to expose the second region.

17. The method of claim 16, wherein a thickness of the sacrificial material deposited on the first region is greater than a thickness of the sacrificial material deposited on the second region.

18. The method of claim 11, wherein the sacrificial layer fills the single layer of polysilicon from a bottom surface to cover the first region.

19. The method of claim 11, further comprising etching the single layer of polysilicon to decrease a thickness of the single layer of polysilicon, before the sacrificial layer is formed.

20. The method of claim 11, further comprising:
   etching the gap-fill insulating layer; and
   forming a conductive pad at a region from which the gap-fill insulating layer is etched.

* * * * *